United States Patent [19]

Tsai

[11] Patent Number: 5,400,216
[45] Date of Patent: Mar. 21, 1995

[54] IC CARD EXPANSION SLOT ASSEMBLY

[76] Inventor: I-Shou Tsai, 8F-6, No.100, Sec.2, Hoping E. Rd., Taipei, Taiwan, Prov. of China

[21] Appl. No.: 117,764

[22] Filed: Sep. 8, 1993

[51] Int. Cl.6 .......................... H05K 7/10; H01R 33/94
[52] U.S. Cl. ...................................... 361/684; 361/752; 439/76; 439/638
[58] Field of Search ................... 439/76, 79, 153, 152, 439/157, 160, 638, 650, 655, 928; 364/708.1; 361/683–686, 752

[56] References Cited

U.S. PATENT DOCUMENTS

| | | | |
|---|---|---|---|
| 3,668,476 | 6/1972 | Wrabel et al. | 439/76 X |
| 4,744,006 | 5/1988 | Duffield | 361/686 |
| 5,036,429 | 7/1991 | Kaneda et al. | 439/928 X |
| 5,187,643 | 2/1993 | I-Shou | 361/685 |

Primary Examiner—Michael W. Phillips
Attorney, Agent, or Firm—Browdy and Neimark

[57] ABSTRACT

An IC card expansion slot assembly comprised of a rectangular housing formed of a bottom shell and a top cover, a PC board fastened inside the bottom shell, an IC card expansion slot mounted on the PC board and aligned with an insertion slot on the front panel of the housing to receive an IC card type hard diskdrive, the PC board having an extension with an electrical connector adapted to insert into the IC card expansion slot on a mobile computer for permitting an IC card type hard diskdrive to be electrically connected to the mobile computer to increase its hard diskdrive memory capacity.

1 Claim, 5 Drawing Sheets

IC CARD EXPANSION SLOT ASSEMBLY

BACKGROUND OF THE INVENTION

The present invention relates to an IC card expansion slot assembly adapted for connecting an external hard diskdrive to a mobile computer to increase its hard diskdrive memory capacity.

A palm-top or notebook computer or any of other types of mobile computers generally has a single IC card expansion slot on each side or two IC card expansion slots on one side for insertion expansion IC cards. Because of the limitation of the size, these IC card expansion slots are not suitable for connecting an IC card type hard diskdrive of capacity over 40M, i.e., the IC card expansion slots of conventional mobile computers are not suitable for connecting a 120M IC card type hard diskdrive. Therefore, the hard diskdrive memory capacity of conventional mobile computers is limited.

SUMMARY OF THE INVENTION

The present invention has been accomplished under the aforesaid circumstances. It is therefore the principal object of the present invention to provide an IC card expansion slot assembly which can be inserted in the IC card expansion slot of a mobile computer to electrically connect a 120M IC card type hard diskdrive to the mobile computer. According to the preferred embodiment, the IC card expansion slot assembly comprises a master PC board received within a housing thereof, and an IC card expansion slot connected to the master PC board for receiving a 120M IC card type hard diskdrive. The PC master board has an extension PC board with a connector designed for inserting into the IC card expansion slot of a mobile computer. By inserting the extension PC board into the IC card expansion slot of a mobile computer, a 120M IC card type hard diskdrive can be electrically connected to the mobile computer to increase its hard diskdrive memory capacity.

DETAILED DESCRIPTION OF THE PREFERRED EMBODIMENT

Figure 1:
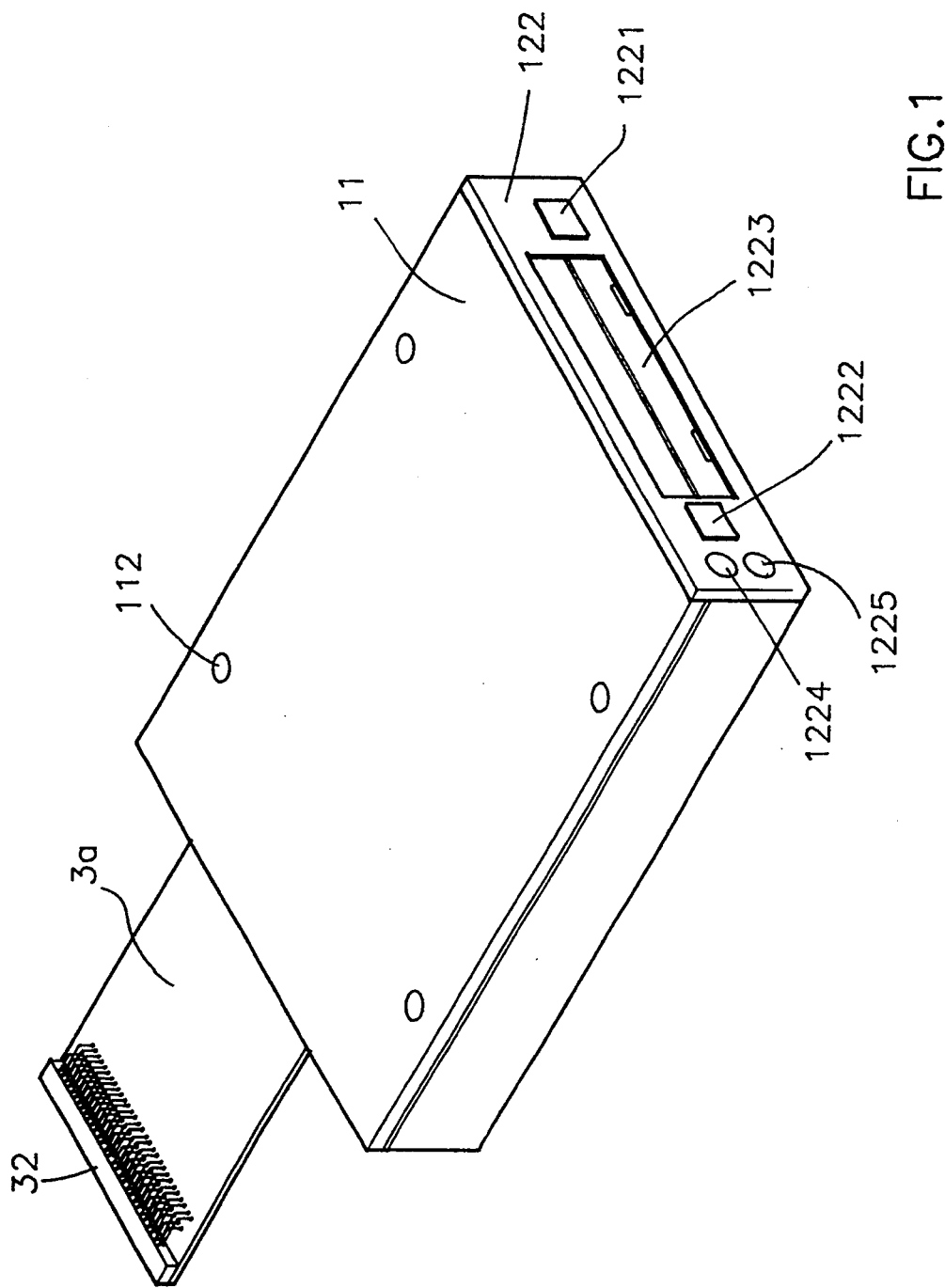
FIG. 1 is an elevational view of an IC card expansion slot assembly according to the preferred embodiment of the present invention.
Figure 2:
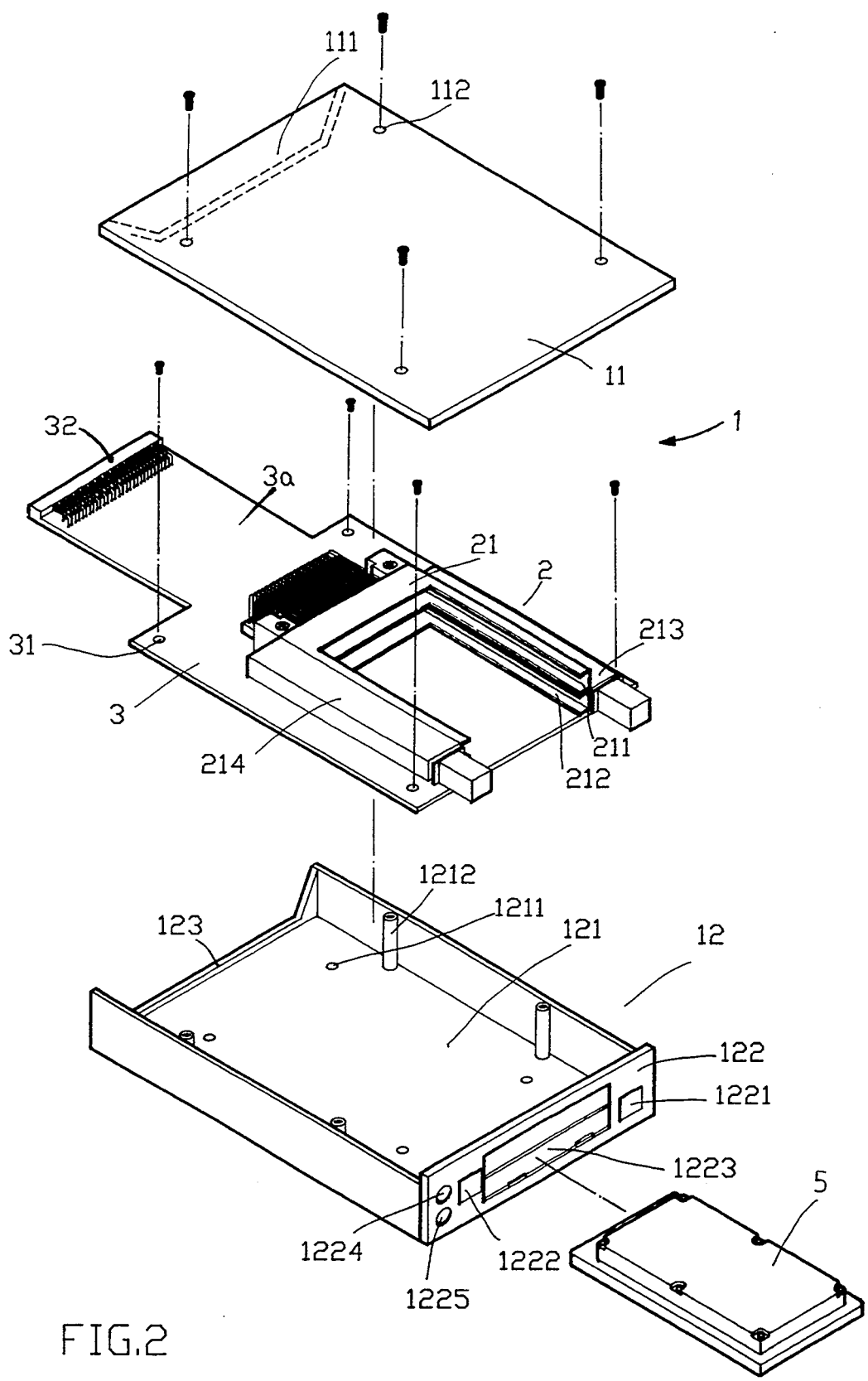
FIG. 2 is an exploded view of the IC card expansion slot assembly shown in FIG. 1.

Referring to FIGS. 1 and 2, an IC card expansion slot assembly in accordance with the present invention is generally comprised of a housing 1, an IC card expansion slot 2, and a PC board 3.

The housing 1 is made in a hollow, substantially rectangular configuration, comprised of a bottom shell 12 and a top cover 11 covered on the bottom shell 12. The top cover 11 comprises a rear bumper 111, and a plurality of screw holes 112 spaced around the border. The bottom shell 12 is made in the shape of a hollow, substantially rectangular case defining an open storage chamber 121. The rectangular storage chamber 121 has an open top. One end of the storage chamber 121 is extended to the outside through a rear recessed portion 123 on bottom shell 12. The opposite end of the storage chamber 121 is covered with a front panel 122. The bottom shell 12 further comprises a plurality of screw holes 1211 and female screw rods 1212 spaced around the border area of the storage chamber 121. The front panel 122 of the bottom shell 12 comprises an insertion slot 1223 transversely disposed in the middle, two button holes 1221;1222 symmetrically disposed on two opposite sides by the insertion slot 1223, and two lamp holes 1224;1225 vertically aligned near one side thereof.

The IC card expansion slot 2 comprises an IC card holder frame 21 defining two vertically spaced symmetrical tracks 211;212, and two guide rods 213;214 symmetrically connected to the IC card holder frame 21 at two opposite sides.

The PC board 3 is welded to the IC card expansion slot 2, comprising an extension PC board 3a in size equal to an IC card, and a plurality of screw holes 31 spaced around the border. The extension PC board 3a has a connector 32 for connecting to a matching computer.

The assembly process of the IC card expansion slot assembly is easy. The PC board 3 and the IC card expansion slot 2 are put in the storage chamber 121 of the bottom shell 12 of the housing 1, permitting the extension PC board 3a to extend out of the storage chamber 121 through the rear recessed portion 123, and permitting the guide rods 213;214 to respectively insert in the button holes 1221;1222 on the front panel 122 of the housing 1, then the screw holes 31 on the PC board 3 are respectively connected to the screw holes 1211 on the bottom shell 12 by screws, then the top cover 1 is covered on the bottom shell 12 and fixed in place by connecting the screw holes 112 of the top cover 1 to the female screw rods 1212 of the bottom shell 12 by screws respectively. When assembled, the rear bumper 111 is inserted in the rear recessed portion 123 and stopped above the PC board 3.

Figure 3:
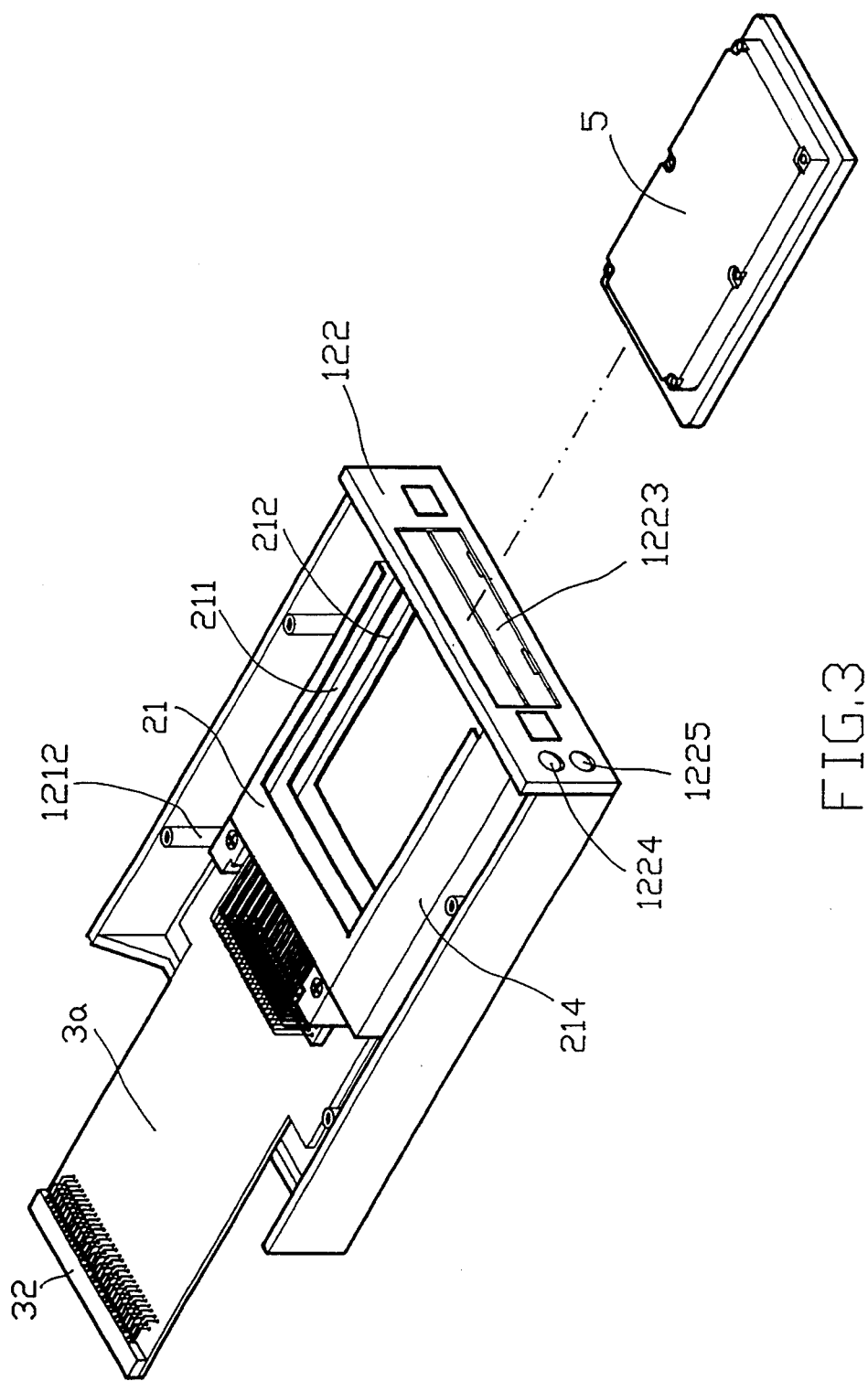
FIG. 3 shows the relative position of the IC card expansion slot inside the bottom shell of the housing of the IC card expansion slot assembly for receiving an IC card type hard diskdrive.
Figure 4:
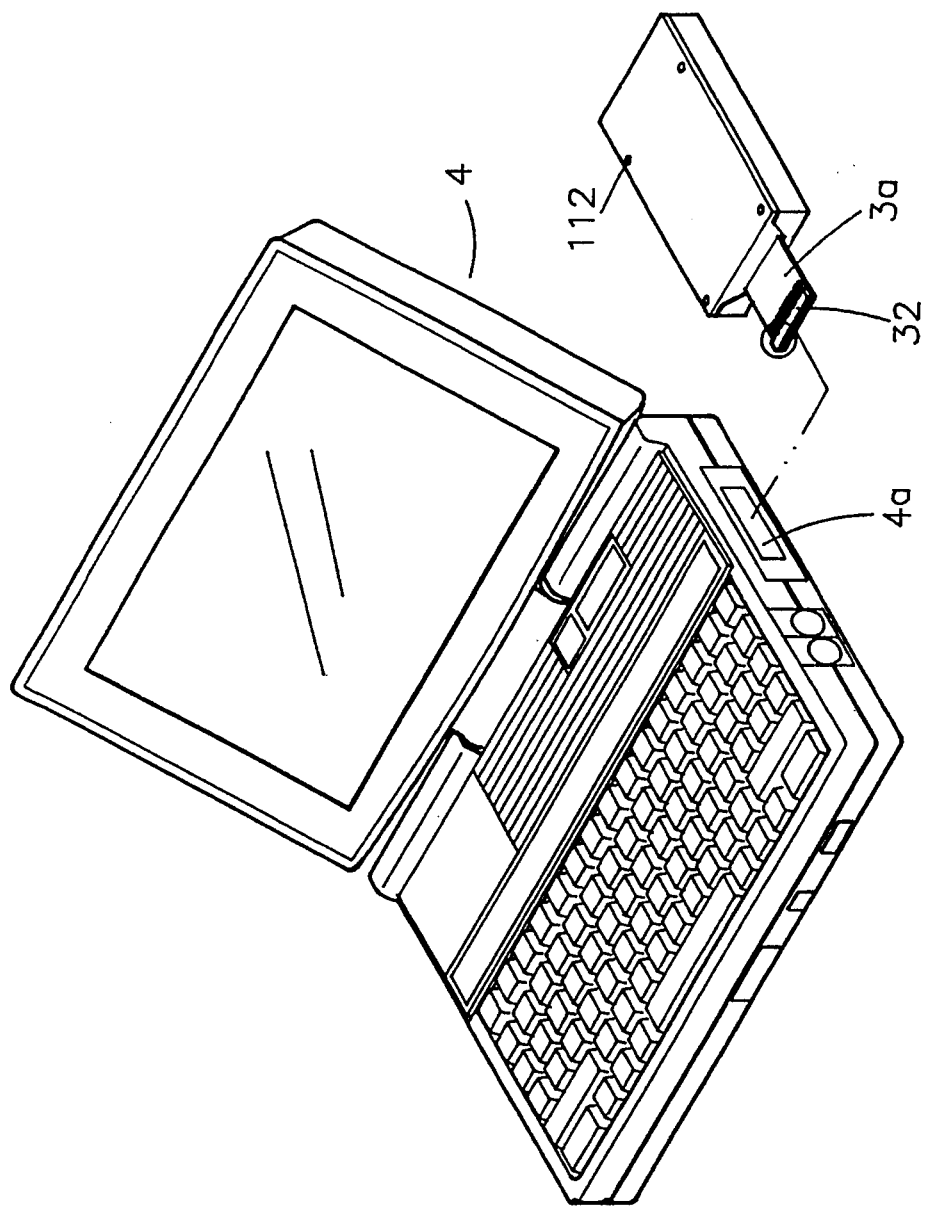
FIG. 4 is an elevational view of a mobile computer and an IC card expansion slot assembly of the present invention showing the relative position between the IC card expansion slot on the mobile computer and the connector on the extension PC board of the IC card expansion slot assembly.
Figure 4A:
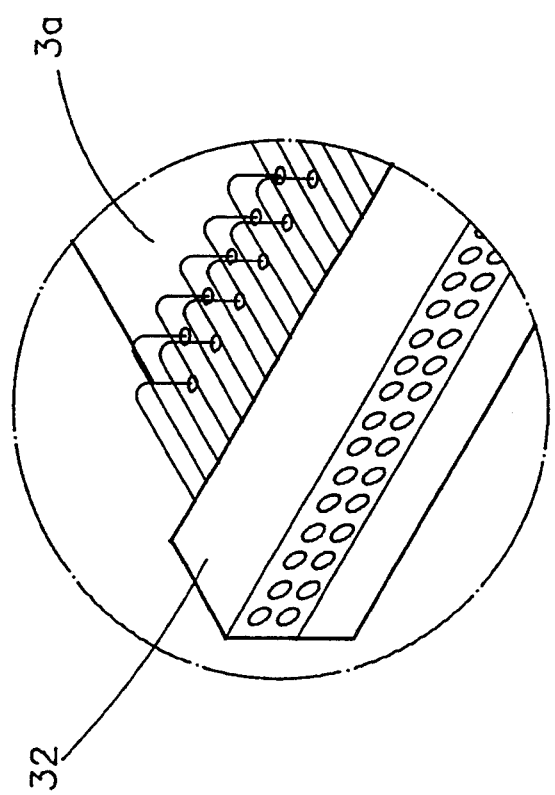
FIG. 4a is an enlarged view of the encircled portion of FIG. 4.

Referring to FIGS. 3, 4, and 4a, an IC card type hard diskdrive 5 can inserted into the IC card holder frame 21 of the IC card expansion slot 2, and then the extension PC board 3a of the PC board 3 can be inserted into the IC card expansion slot 4a of a mobile computer 4 to electrically connect the hard diskdrive 5 to the computer 4.

Therefore, an IC card type hard diskdrive can be connected to a mobile computer by means of the IC card expansion slot assembly, so as to increase the memory capacity of the hard diskdrive of the mobile computer up to more than 120M.

What is claimed is:

1. An IC card expansion slot assembly comprising:
   a housing comprised of a bottom shell having a border and a top cover covered on said bottom shell, said bottom shell comprising a rear recessed portion, a plurality of screw holes and a plurality of female screw rods spaced on the inside around the border, and a front panel, said front panel comprising an insertion slot transversely disposed in the middle for inserting an IC card type hard diskdrive, two button holes symmetrically disposed on two opposite sides by said insertion slot, and two lamp holes for holding indicator lamps, said top cover comprising a plurality of screw holes respectively connected to said female screw rods by screws, and a rear bumper inserted into said rear recessed portion with a horizontal gap defined therebetween;

a printed circuit board received in said housing, said printed circuit board comprising a plurality of screw holes respectively connected to the screw holes on said bottom shell by screws, and an extension portion extended out of said housing through the horizontal gap between said rear recessed portion and said bumper for inserting into the IC card expansion slot of a mobile computer, said extension portion having an electrical connector for electrically connecting to a master board of the mobile computer; and an IC card expansion slot mounted on said printed circuit board inside said housing and electrically connected to said printed circuit board, said IC card expansion slot being aligned with said insertion slot of said front panel of said housing to receive an IC card type hard diskdrive for permitting it to be electrically connected to said mobile computer.

* * * * *